United States Patent [19]

Easter et al.

[11] Patent Number: 4,839,309
[45] Date of Patent: Jun. 13, 1989

[54] FABRICATION OF HIGH-SPEED DIELECTRICALLY ISOLATED DEVICES UTILIZING BURIED SILICIDE OUTDIFFUSION

[75] Inventors: William G. Easter; Anatoly Feygenson, both of Reading, Pa.

[73] Assignees: American Telephone and Telegraph Company, AT&T Technologies, Inc., Berkeley Heights; AT&T Bell Laboratories, Murray Hill, both of N.J.

[21] Appl. No.: 175,016

[22] Filed: Mar. 30, 1988

[51] Int. Cl.⁴ .................................. H01L 21/225
[52] U.S. Cl. .................... 437/160; 437/162; 437/200; 437/203; 437/32; 437/40; 437/62; 437/78; 437/26; 437/913; 437/917; 437/2; 148/DIG. 19; 148/DIG. 123; 148/DIG. 147; 357/23.1; 357/67; 357/35
[58] Field of Search ................... 437/60–68, 437/160, 161, 162, 163, 200, 203, 192, 40, 78, 26, 913, 917, 31, 32; 148/DIG. 19, DIG. 123, DIG. 147

[56] References Cited

U.S. PATENT DOCUMENTS

| | | |
|---|---|---|
| 3,381,182 | 4/1968 | Thornton .................... 317/234 |
| 3,653,120 | 4/1972 | Sirrine et al. ................. 29/589 |
| 3,938,176 | 2/1976 | Sloan, Jr. .................... 437/68 |
| 4,356,622 | 11/1982 | Widmann .................... 29/571 |
| 4,520,552 | 6/1985 | Arnould et al. ............... 437/67 |
| 4,553,318 | 11/1985 | Chandrasekhar ............. 29/577 |
| 4,569,701 | 2/1986 | Oh ............................ 437/67 |
| 4,593,458 | 6/1986 | Adler ........................ 29/576 W |

Primary Examiner—Brian E. Hearn
Assistant Examiner—T. N. Quach
Attorney, Agent, or Firm—Wendy W. Koba

[57] ABSTRACT

A method of fabricating a dielectrically-isolated structure is disclosed wherein the structure includes a layer of silicide which is selectively doped, preferably using an ion implantation process. The doped silicide is then used as the diffusion source for the subsequent formation (through a heat treatment) of various active portions (collector, emitter, drain, source, for example) of a variety of high-voltage, high-speed active devices. The non-doped silicide is advantageously utilized as a low-resistance contact between the buried diffusion region and the surface electrode. In an alternative embodiment, bottom portions of the silicide contiguous to the tub are removed, leaving only vertical silicide portions adjacent to the sidewalls of the dielectrically isolated tub.

12 Claims, 4 Drawing Sheets

FABRICATION OF HIGH-SPEED DIELECTRICALLY ISOLATED DEVICES UTILIZING BURIED SILICIDE OUTDIFFUSION

BACKGROUND OF THE INVENTION

1. Field of the Invention

The present invention relates to the general field of dielectrically-isolated (DI) high-voltage devices and, more particularly, to a new class of devices which include selective areas of doped silicide used to fabricate high-speed, high-frequency devices.

2. Description of the Prior Art

For many high voltage applications, dielectric isolation is utilized to prevent interaction between adjacent integrated circuit devices formed on a common semiconductor substrate. Basically, dielectric isolation refers to the use of a layer of dielectric material (silicon dioxide, for example) to surround a region, or tub, containing a high-voltage device structure. As long as the reverse breakdown voltage of the dielectric is not surpassed, the high voltage devices will operate properly. One exemplary DI structure is disclosed in U.S. Pat. No. 4,593,458 issued to M S. Adler on June 10, 1986.

In the past, these DI device structures were often limited in the speed of their performance, primarily as a function of the sheet resistance of the material forming the tub region. One solution is to this problem is disclosed in U.S. Pat. No. 3,381,182 issued to C. G. Thornton on Apr. 30, 1968. Thornton teaches a DI structure which includes a silicide layer (MoSi$_2$, for example) which is disposed to completely surround the dielectric (see FIG. 1c). As proposed by Thornton, this silicide layer thus makes a wide area contact between a buried low resistivity region (the bottom of the tub) and a higher resistivity collector region, thus significantly reducing the collector resistance and increasing the device speed.

Although this silicide layer is adequate in performing this function, there exist many other high-voltage device structures, both bipolar and MOS, which cannot enjoy the same benefits of this silicide wrap-around layer.

Thus, a need remains in the prior art for some means of providing improved speed performance to various devices formed in the high-voltage DI structure.

SUMMARY OF THE INVENTION

The need remaining in the prior art is addressed by the present invention which relates to a high-speed dielectrically isolated (DI) structure and, more particularly, to such a structure which utilizes buried sections of doped silicide to improve the speed of a variety of integrated device structures.

In accordance with the teachings of the present invention, the conventional DI fabrication process is modified to allow for the inclusion of a silicide region or regions within the tub, adjacent to the isolation layer. An ion implant process is performed to selectively dope (either n-type or p-type, as required) the silicide. The structure is subsequently heated to diffuse the implanted impurities into the surrounding silicon substrate. The combination of the remaining undoped silicide with the diffused silicon regions is then used as one active region (i.e., collector, emitter, drain, source, etc.) of a variety of integrated circuit device structures.

In one embodiment of the present invention, the silicide layer is formed so as to completely surround the bottom and sidewalls of the DI tub, with the lower portion of the silicide region being ion implanted so as to subsequently form a diffusion region across the bottom of the tub (see FIG. 5).

In another embodiment of the present invention, the doped silicide is subject to a reactive ion etch (RIE) to remove all horizontal portions of the silicide. The types of devices formed from this structure thus include, in final form, silicide sidewalls with selected portions of the sidewalls containing an ion implanted impurity region (see FIG. 11).

A thorough understanding of the fabrication process of the present invention, as well as a description of some of the various devices which may be formed to include the doped silicide regions of the present invention will become apparent during the course of the following discussion and by reference to the accompanying drawings.

BRIEF DESCRIPTION OF THE DRAWING

Referring now to the drawings, where like numerals represent like elements in several views.

DETAILED DESCRIPTION

Figure 1:
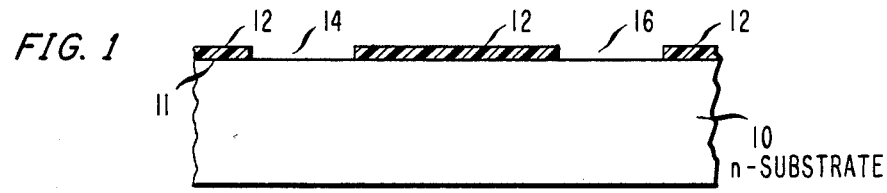
FIGS. 1-5 illustrate an exemplary process for fabricating a first generic DI structure to include a doped silicide region around the bottom of a DI tub.
Figure 2:
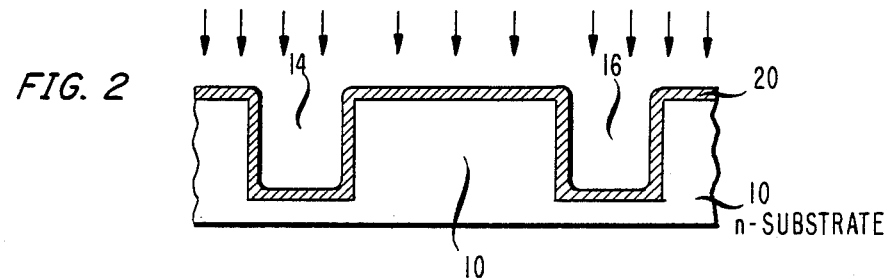

An exemplary process for fabricating a dielectrically isolated (DI) structure which includes a doped silicide region is illustrated in FIGS. 1-5. FIG. 1 illustrates the starting point for the fabrication process, where a substrate 10, here illustrated as being an n-type substrate, is covered with a masking layer 12. Masking layer 12 may simply be an oxide layer which is either grown or deposited over top surface 11 of substrate 12. A pair of windows 14 and 16 are opened in mask layer 12, where these windows serve to define the vertical walls of the final DI tub structure. The structure of FIG. 1 is then etched to remove a selected amount of the substrate material exposed by windows 14 and 16, as shown in FIG. 2. This etching results in the formation of a central substrate region 18 which will eventually form an exemplary tub region of the final DI structure. Subsequent to this etch, a silicide layer 20 is deposited to completely cover the exposed top surface of the silicon substrate. This silicide may be formed either by depositing an appropriate metal (for example, Ti, Ta, Mo, W, or any other silicide formed from Groups IVB, VB, VIB or VIIB) over the surface and reacting the metal with the silicon to form the silicide, or a silicide material may be directly deposited.

Figure 3:
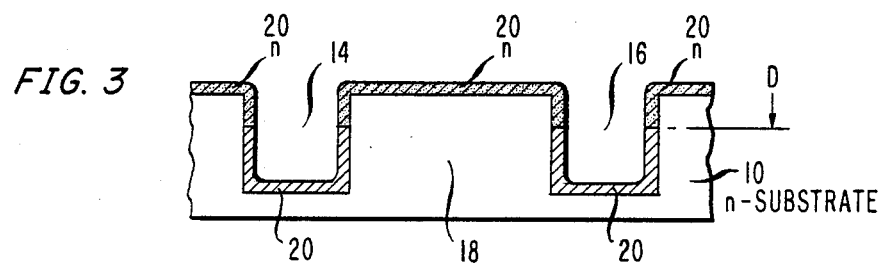

In accordance with the teachings of the present invention, selected areas of the silicide are then doped so that they may be the source of impurities for a subsequent diffusion operation. An ion implantation process may be utilized for this purpose, with the energy and dosage of the implantation being controlled such that the ions are driven as close to the silicide/silicon interface as possible. In one exemplary arrangement, an n-type ion implant, using phosphorus, may be performed at an energy of 30 keV, with a dosage greater than $1 \times 10^{15} cm^{-2}$, yielding a dopant concentration in the silicide region of greater than $2 \times 10^{19} cm^{-3}$. The result of such a process is illustrated in FIG. 3, where the shaded portions of silicide layer 20 have been converted to n-type silicide. As shown, the energy and dose of the implant have been chosen so that the impurities will reach a depth D into the substrate. Since a ion implant process has been utilized, the sidewall regions of silicide layer 20 beyond this depth will contain little, if any, impurities.

Figure 4:
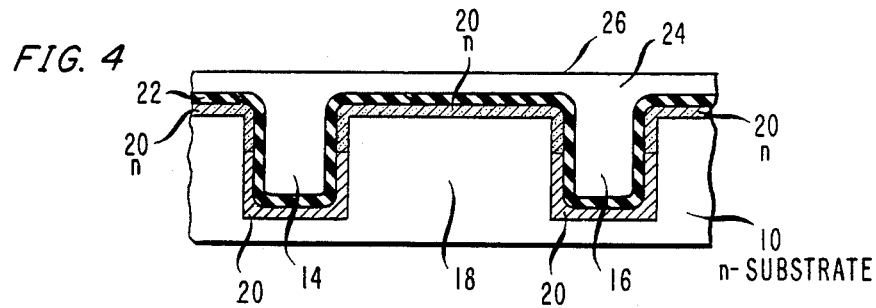
Figure 5:
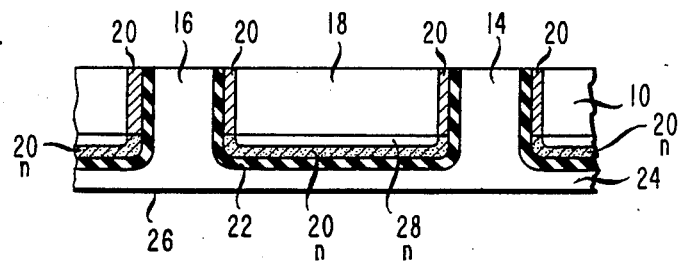

An oxide layer 22, as shown in FIG. 4, is then deposited so as to completely cover silicide layer 20. Since any type of high temperature operation would result in unwanted (and uncontrolled) impurity migration, this oxide must be deposited (not grown) using any type of well-known low temperature technique. For example, this oxide could be deposited using a low pressure chemical vapor deposition (LPCVD) technique. Following the oxide deposition, a polysilicon layer 24 is formed over oxide layer 22, where polysilicon layer 24 will form the support of the final DI device structure. Polysilicon layer 24 is then planarized, using well-known grinding techniques, so as to form an essentially flat top surface 26. As described below, surface 26 is utilized as a reference surface in forming the DI tubs, so it is important that surface 26 be as flat as possible. FIG. 5 illustrates the DI structure subsequent to the formation of the isolated tub structure. In order to form this structure, the arrangement as shown in FIG. 4 is inverted so that surface 26 becomes the bottom support surface. The top surface of silicon substrate 10 is then ground and polished, using surface 26 as a guide, until the portion of monocrystalline silicon 10 in tub region 18 is exposed, as shown in FIG. 5.

In accordance with the present invention, the impurities implanted into silicide 20 must be migrated into the silicon region of tub 18. This process may be accomplished by heating the structure to a temperature sufficient (>700° C., for example) to diffuse the impurities into the tub region. For the particular structure illustrated in FIG. 5, the impurities will migrate into the bottom of tub 18, forming an n-type region 28. It is to be understood that this particular heat treatment, or anneal, may be performed at any point in time after the ion implantation. In fact, the polysilicon deposition process may be performed at a temperature sufficient to also provide the impurity migration. However, by performing the anneal subsequent to the various grinding and polishing steps, any surface damage created by these steps may be eliminated by the high temperature treatment.

Figure 6:
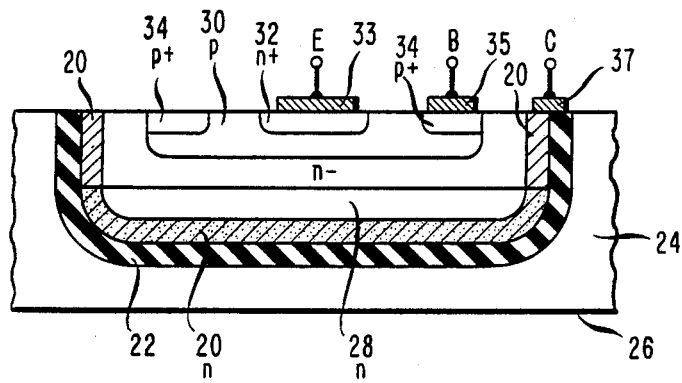
FIGS. 6-8 illustrate three different integrated circuit devices (bipolar transistor, depletion-mode junction FET, and a dual-gate FET) which may be formed from the generic structure of FIG. 5.

The structure as illustrated in FIG. 5 may serve as the generic structure for a variety of different high-speed integrated devices. One such device, a high-speed lateral NPN bipolar transistor is illustrated in FIG. 6. As shown, this particular device includes a p-type region 30 formed in tub 18. For the purposes of constructing this particular device, n-doped silicon 10 was utilized to form tub 18. An n+diffusion region 32, forming the emitter diffusion of the structure is subsequently formed within p-type region 30. A metal electrode 33 is subsequently formed to contact emitter region 32. Similarly, a p+ diffusion region 34 is formed in p-type region 30, where p+ diffusion region 34 forms the base diffusion of the final transistor structure. A metal electrode 35 is subsequently contacted to emitter region 34. The collector region of the transistor structure comprises the n-type diffusion region 28 formed as described above. In accordance with the teachings of the present invention, silicide layer 20 functions as the collector contact area, where a metal electrode 37, located as shown in FIG. 6, is disposed to contact the portion of silicide layer 20 which is exposed at the top surface of the device. Since the silicide exhibits a sheet resistance significantly less than monocrystalline silicon material forming tub 18 (2–4 ohm/square versus 100 ohm/square for a 1000Å thick film), collector series resistance of the structure of the present invention will likewise decrease by at least an order of magnitude. Since this resistance is directly related to the RC time constant of the transistor structure, the utilization of silicide layer 20 as disclosed in the present invention, will significantly increase the speed of this transistor structure.

It is to be understood that a complementary type of high-speed bipolar transistor (that is, a high-speed PNP transistor), may also be formed using the techniques of the present invention. In order to form the PNP structure, the ion implant process associated with silicide layer 20 is merely altered to utilize as an impurity source a p-type donor, boron, for example. It is to be recognized that both the energy and dosage of an ion implant with boron, as compared with phosphorus, may need to be modified to obtain the required dopant concentration. In a similar fashion, the remaining diffusion regions utilized to form the transistor structure are formed with a dopant of the opposite conductivity type.

Figure 7:
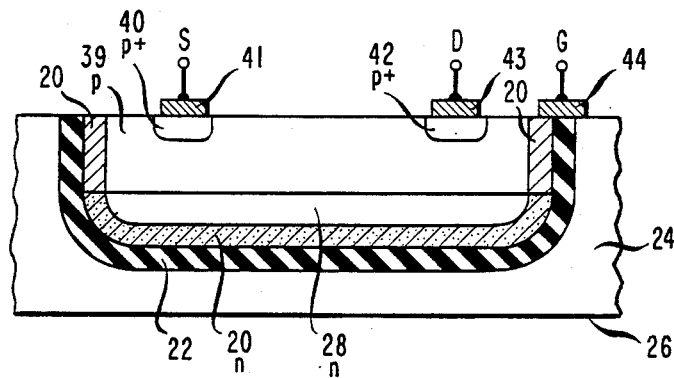

The particular generic DI structure illustrated in FIG. 5 may be used to form devices other than the high speed bipolar transistor illustrated in FIG. 6. For example, a depletion-mode junction FET may be formed within this structure, as illustrated in FIG. 7. As shown, this structure utilizes a p-type tub region 39, with a p+ source diffusion region 40 and a p+drain diffusion region 42 formed in a spaced-apart manner within tub 39. A source electrode 41 is positioned to contact source diffusion 40 and a drain electrode 43 is used to contact drain diffusion 42. The gate region of this particular structure comprises n-type diffusion region 28, formed as described above in association with FIG. 5. Advantageously, silicide layer 20 is utilized as the gate contact layer, with a gate electrode 44 formed on the top surface to contact silicide layer 20.

Figure 8:
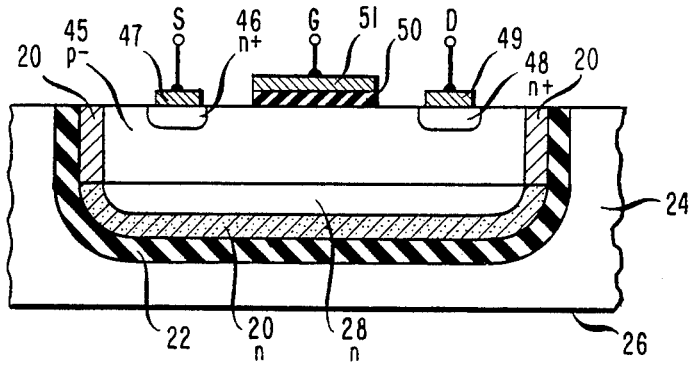

FIG. 8 illustrates yet another device which may be formed from the basic DI structure of FIG. 5. The device illustrated in FIG. 8 comprises an nchannel FET, where the gate threshold voltage is controlled/-regulated by the utilization of an additional voltage applied to n-type diffusion region 28. In particular, this structure comprises an n+ source diffusion region 46, and an n+ drain diffusion region 48, separated in a p-type tub region 45 so as to form the channel of the transistor. A gate oxide 50 is disposed on the device surface above this channel region. A source electrode 47, a drain electrode 49, and a gate electrode 51 are disposed to contact the various regions described above. Additionally, as previously mentioned, a control electrode 52 is disposed to contact silicide layer 20. If no voltage were applied to control electrode 52, the FET would operate in a conventional fashion, with the gate threshold voltage being controlled by the material forming tub region 45. Alternatively, this gate threshold voltage may be modified by applying a voltage to control electrode 52, which by interacting with diffusion region 28, will modify the electric field present in the channel region. This modification will result in the requirement of a different gate threshold voltage (either higher or lower, as a function of the polarity of the applied control voltage) in order to activate the transistor action.

It is to be noted at this point that the three different devices illustrated in FIGS. 6-8 are merely examples of the type of device which may be formed in the DI structure of FIG. 5. Various other devices may also be formed in this particular inventive generic DI structure illustrated in FIG. 5.

Figure 9:
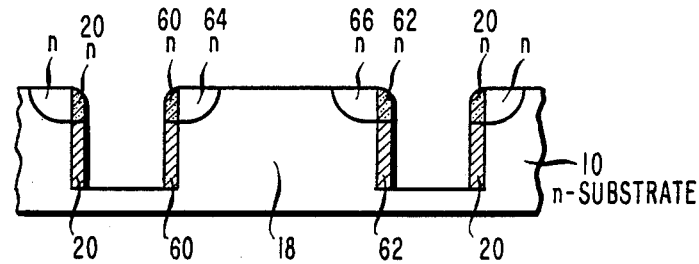
FIGS. 9-11 are illustrative of an alternative fabrication process of the present invention which results in the formation of an alternative generic DI structure which includes doped silicide sidewalls within the tub region.
Figure 10:
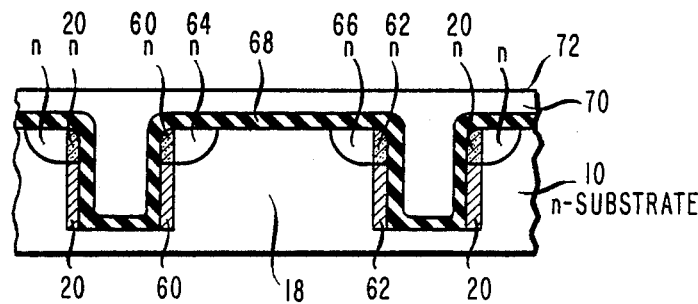
Figure 11:
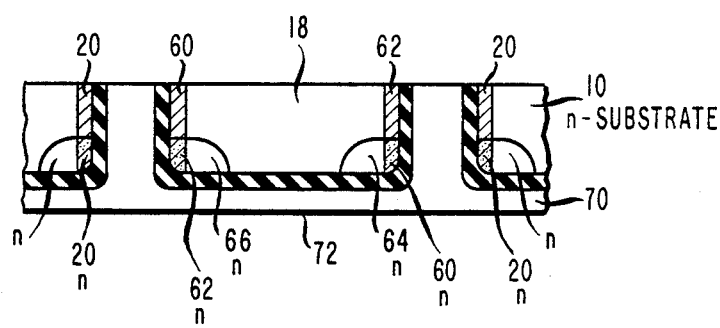

As stated above, silicide layer 20 may be selectively etched in order to form yet another variety of DI integrated circuit structures which derive benefits from the utilization of doped silicide regions, in this particular case, doped silicide sidewalls. An exemplary fabrication process for forming a generic DI structure which contains doped silicide sidewalls is illustrated in FIGS. 9-11. Referring in particular to FIG. 9, the first step in obtaining this structure is to perform a reactive ion etch (RIE) upon the previously-described structure illustrated in FIG. 3. That is, a reactive ion etch is performed subsequent to the ion implant of silicide layer 20 and prior to the formation of the covering oxide layer. As is well-known in the art, a reactive ion etch will remove all horizontal portions of the exposed material, in this case leaving silicide sidewalls 60 and 62 as illustrated in FIG. 9. The remainder of the fabrication process is similar to that described above. In particular, as illustrated in FIG. 9, a heat treatment (anneal) step is performed which causes the n-tye impurities present in sidewalls 60 and 62 to migrate into tub region 18, forming a pair of n-type diffusion regions 64 and 66 within tub 18. Subsequent to this heat treatment, an oxide layer 68 is formed, using a low temperature process, so as to completely cover the top surface of the device; both the exposed single crystal silicon 10 and silicide sidewalls 60,62, as illustrated in FIG. 10. A thick polysilicon layer 70 is subsequently deposited and planarized so as to have an essentially flat top surface 72. As with the fabrication process described above in association with FIGS. 3-5, surface 72 will serve as the reference surface during the subsequent grinding and polishing operations used to expose tub region 18. It is to be understood that as with the above-described process of FIGS. 3-5, the heat treatment which provides the ion migration into tub region 18 may also be performed at the end of the tub formation process, subsequent to the exposure of tub region 18.

Figure 12:
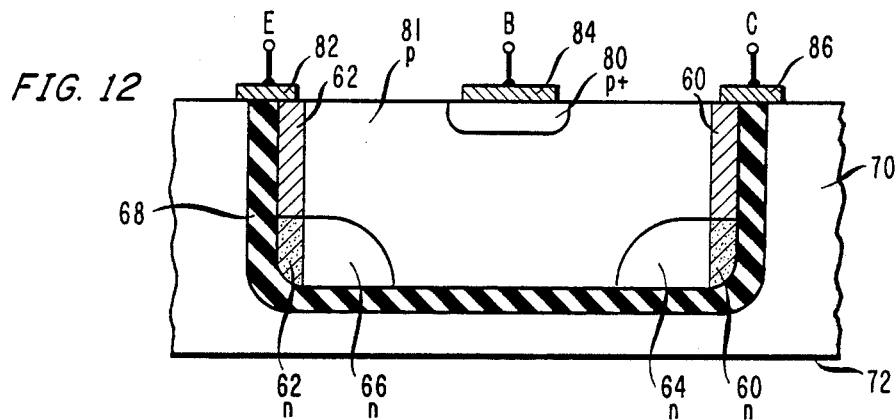
FIGS. 12-14 are illustrative of three different devices (bipolar transistor, MOS field effect transistor, and junction field effect transistor, respectively) which may be formed in the generic structure illustrated in FIG. 11.

The generic DI structure including silicide sidewalls 60,62 is illustrated in FIG. 11. As with the generic DI structure of FIG. 5, a wide variety of integrated circuit devices may be formed from the structure illustrated in FIG. 11. One exemplary structure, a lateral NPN bipolar transistor, is illustrated in FIG. 12. As shown, this structure includes a p+ base diffusion region 80 formed in the top surface of p-type tub region 81. The emitter of this structure comprises the n-type diffusion region 66 formed during the silicide anneal, and the collector region similarly comprises the n-type diffusion region 64 formed during the same process. The connection to emitter diffusion region 66 is provided by silicide sidewall 62 and a corresponding surface electrode 82. The connection to collector diffusion region 64 is provided by silicide sidewall 60 and a surface electrode 80. It is obvious from the structure of this particular device that the transistor action will occur in the bottom area of tub 81, in the vicinity of emitter region 66 and collector region 64. Since this particular DI structure may be made to be as shallow as desired, this particular device can essentially be considered as a lateral surface device, with the speed improvement attributed to the utilization of the silicide emitter and collector connections. Additionally, it is to be remembered that this device, as well as all other discussed devices, also enjoys the isolation benefits of the DI structure and may thus be operated not only at high speeds, but also at substrate voltages well exceeding 300 V.

Figure 13:
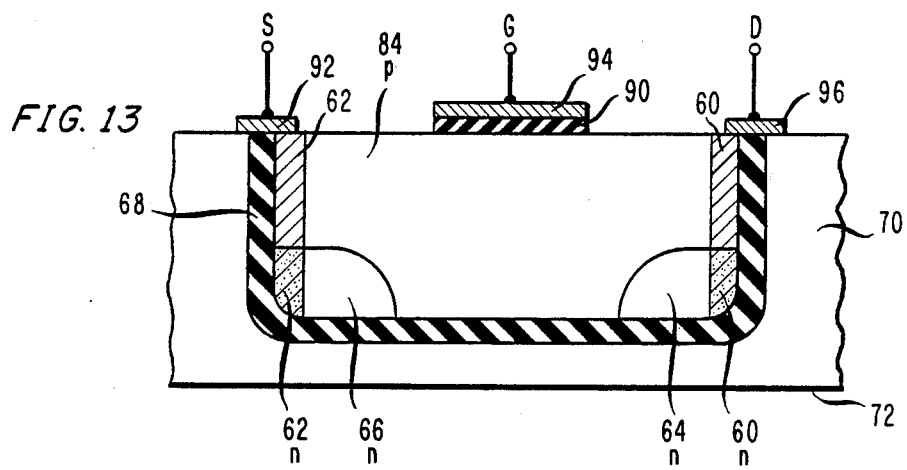

FIG. 13 illustrates a conventional field effect transistor which may be formed from the generic DI structure with silicide sidewalls as illustrated in FIG. 11. In particular, the FET of FIG. 13 utilizes n-type diffusion region 66 as the source diffusion region, and n-type diffusion region 64 as the drain diffusion region. The channel of the transistor is defined as the region of p-tub 81 located between these regions. A gate oxide 90 is disposed on the top surface of the structure above the channel region. As shown, a source electrode 92, a gate electrode 94 and a drain electrode 96 complete the device structure. Silicide sidewall 62 serves as the connection between source diffusion 66 and electrode 92 and, in a similar fashion, silicide sidewall 60 provides the connection between drain diffusion 64 and electrode 96. As with the bipolar device of FIG. 12, the transistor action of the FET of FIG. 13 will take place in the bottom of tub 81, where this tub may be made as shallow as desired.

Figure 14:
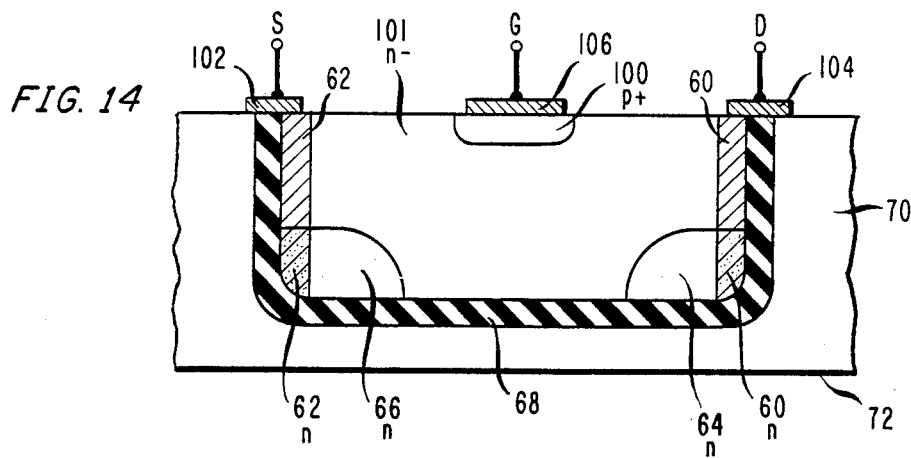

A junction FET, formed from the generic DI structure of FIG. 11, is illustrated in FIG. 14. As with the FET of FIG. 13, n-type diffusion region 66 is utilized as the source diffusion and n-type region 64 is used as the drain diffusion. For this particular device to function properly, it is necessary to utilize an n- type tub 101. A p+ gate diffusion region 100 is formed in the top surface of tub 101. A source electrode 102 is connected via silicide sidewall 62 to the source diffusion region 66, with a drain electrode 104 coupled to drain diffusion region 64 by silicide sidewall 60. A gate electrode 106 is disposed to contact gate diffusion region 100. In the absence of a voltage applied to gate electrode 106, conduction will occur along the bottom of tub 101 between source diffusion 66 and drain diffusion 64. With the application of a voltage to gate electrode 106, p+ region 100 will expand in size and eventually pinch-off the conduction path between the diffusions, thus turning the transistor off.

it is to be noted that the particular devices illustrated in FIGS. 12-14 are merely illustrative of the types of devices which may be formed int he generic structure of FIG. 11. Further, the scope of the present invention is considered to encompass into only the exemplary generic structures of FIGS. 5 and 11, but to include any type of dielectrically isolated structure which include doped silicide sections used as the diffusion source for any active portion of the device formed within the DI structure.

What is claimed is:

1. A method of forming a semiconductor device within a dielectrically isolated tub region of a silicon substrate, the method comprising the steps of:

a. forming a metal silicide layer within said tub so as to be contiguous with the dielectric isolation;
b. doping said silicide layer in a selective manner with an impurity of a predetermined conductivity type; and
c. heating said substrate to a temperature sufficient to diffuse the implanted impurities into the adjacent tub region, wherein said diffusion region is defined as an active portion of the semiconductor device structure.

2. The method according to claim 1 wherein in performing step (a), the silicide layer is formed by directly depositing a layer of silicide material from the group consisting of Group IVB, VB, VIB or VIIB silicides.

3. The method according to claim 1 wherein in performing step (a), the silicide layer is formed by depositing a layer of metal form the group consisting of Group IVB, VB, VIB or VIIB metals, and heating the substrate in a manner so that the silicon underlying the metal will react therewith so as to form the silicide.

4. The method according to claims 1, 2 or 3 wherein in performing step (a), the silicide layer is formed so as to completely cover the sidewalls and bottom of the tub.

5. The method according to claims 1, 2 or 3 wherein performing step (a), the silicide layer is selectively etched to remove predetermined portions thereof.

6. The method according to claim 5 wherein the etching is performed to remove the silicide adjacent to the bottom of the tub, so that the remaining silicide is adjacent only to the sidewalls of the tub.

7. The method according to claim 6 wherein reactive ion etching (RIE) is used to remove the bottom portion of the silicide layer.

8. The method according to claims 1, 2 or 3 wherein in performing step b), the doping is performed by an ion implantation process.

9. The method according to claim 8 wherein phosphorus is utilized as the dopant so as to create selected regions of n-type silicide.

10. The method according to claim 9 wherein the phosphorus comprises a dosage of approximately $1 \times 10^{15} cm^{-2}$ and is implant with an energy of approximately 30 keV so as to create a silicide region with a dopant concentration of approximately $2 \times 10^{19} cm^{-3}$.

11. The method according to claim 8 wherein boron is utilizes as the dopant so as to create selected regions of p-type silicide.

12. The method according to claims 1, 2 or 3 wherein in performing step (c), the substrate is heated to a temperature greater than 700° C.

* * * * *